United States Patent
Vere et al.

(10) Patent No.: US 6,803,114 B1
(45) Date of Patent: Oct. 12, 2004

(54) MANUFACTURING PROCESS FOR LAMINATED CARDS WITH INTERMEDIATE PETG LAYER

(75) Inventors: Denis Vere, Darvoy (FR); Eric Daniel, Saint Jean le Blanc (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 10/030,205

(22) PCT Filed: Jul. 3, 2000

(86) PCT No.: PCT/FR00/01896

§ 371 (c)(1),
(2), (4) Date: May 13, 2002

(87) PCT Pub. No.: WO01/03061

PCT Pub. Date: Jan. 11, 2001

(30) Foreign Application Priority Data

Jul. 1, 1999 (FR) .............................. 99 08506

(51) Int. Cl.[7] .................. B32B 27/08; B32B 27/36; B32B 31/04; B32B 31/20; H01L 23/02
(52) U.S. Cl. ................... 428/480; 428/212; 428/213; 235/488; 257/678; 257/679; 361/728; 361/736; 361/737; 361/739; 361/746; 361/761; 361/764; 156/308.2; 156/209.6
(58) Field of Search .................... 428/480, 213, 428/212; 156/308.2, 309.6; 361/728, 736, 746, 737, 739, 761, 764; 235/488; 257/678, 679

(56) References Cited

U.S. PATENT DOCUMENTS

| | | | | |
|---|---|---|---|---|
| 4,617,216 A | * | 10/1986 | Haghiri-Tehrani et al. | .... 428/67 |
| 5,534,372 A | * | 7/1996 | Koshizuka et al. | ........... 430/10 |
| 5,671,525 A | * | 9/1997 | Fidalgo | ....................... 29/600 |
| 5,846,900 A | * | 12/1998 | Reiter et al. | ................ 503/227 |
| 5,928,788 A | * | 7/1999 | Riedl | ..................... 428/411.1 |
| 5,969,951 A | * | 10/1999 | Fischer et al. | .............. 361/737 |
| 6,012,641 A | * | 1/2000 | Watada | ........................ 235/488 |
| 6,208,019 B1 | * | 3/2001 | Tane et al. | .................. 257/679 |
| 6,250,555 B1 | * | 6/2001 | Inamoto | ..................... 235/487 |
| 6,301,119 B1 | * | 10/2001 | Thevenot et al. | ........... 361/737 |

FOREIGN PATENT DOCUMENTS

| | | |
|---|---|---|
| EP | 0 640 940 A2 | 3/1995 |
| EP | 0 640 940 A | 3/1995 |
| EP | 0 706 152 A2 | 4/1996 |
| EP | 0 706 152 A | 4/1996 |
| EP | 0 706 152 B1 | 6/1998 |

* cited by examiner

Primary Examiner—Vivian Chen
(74) Attorney, Agent, or Firm—Osha Novak & May L.L.P.

(57) ABSTRACT

The invention involves a card, including a card body including at least three laminated plastic layers directly superimposed on each other, a second layer being a layer in polyethylene terephthalate glycol placed between a first layer and a third layer, the first layer and third layer being of a chemical nature different from that of said second layer, and an electronic module being incorporated in a cavity of the card body, the module including an integrated circuit, where the thickness of the second layer is of the same order of magnitude as that of the first and third layers, and wherein the cavity extends into the second layer from the first layer.

4 Claims, 3 Drawing Sheets

MANUFACTURING PROCESS FOR LAMINATED CARDS WITH INTERMEDIATE PETG LAYER

FIELD OF THE INVENTION

The invention concerns a manufacturing process for laminated cards, and cards obtained by means of a process of this type.

The cards according to the invention are chip cards comprising a plastic card body, and an electronic module integrated in said card body, comprising an integrated circuit the contact pads of which are connected to other pads flush with the surface of the card body and/or the terminals of an antenna embodied in said card body.

Cards of this type are principally designed for processing or storing confidential data, for example for the purpose of executing electronic transactions in a variety of domains such as health care, pay TV, telephony and banking.

Cards of this type are generally personalized in -such a way as to identify their holders, and consequently carry printed marks for this purpose.

BACKGROUND OF INVENTION

Various processes are known for the manufacture of cards. Some processes involve hot lamination. According to these processes, the different layers forming the body of the card are assembled at given pressures and temperatures, such that the plastic materials used in their manufacture reach their setting point, and inter-penetrate locally to create largely coherent laminated assemblies. These assemblies are then printed and cut to the required dimensions for a card body. A cavity is then milled in each body, and an electronic module is finally inserted and bonded in said cavity.

In these processes, the known materials used in the construction of the various layers are acrylonitrile butadiene styrene (ABS), polyvinyl chloride (PVC), ABS/PVC mixtures, polyethylene terephthalate (PET), polyethylene terephthalate glycol (PETG) and polycarbonate (PC). Frequently the various layers constituting the card body are of the same chemical nature, for example, all in PVC. In particular, the various superimposed layers in known PETG cards are all in PETG.

The manufacturing processes for state of the art cards, and cards obtained using processes of this type, nevertheless present a number of drawbacks.

In particular, cards in ABS, PVC, ABS/PVC mixtures, PET and PC show limited resistance to dynamic, longitudinal and lateral bending. In general, they crack after about 1,500 dynamic longitudinal bends, with a 20 mm deflection centered on the card body, and about 1,500 lateral dynamic bends with a 10 mm centered deflection.

However, this is not the case with cards in PETG, which on the contrary, show good resistance to the above bending loads. Nevertheless, given the low viscosity of PETG at normal laminating temperature and pressure conditions, it is necessary to reduce laminating temperatures at a given pressure, to avoid all the drawbacks of PETG creep in the laminating equipment. However, at these reduced temperatures, the coherence of the laminated assemblies obtained is found to be mediocre, and it is difficult in practice to find a compromise which makes it possible to avoid both PETG creep problems and the coherence drawbacks of said laminated assemblies at the same time.

SUMMARY OF THE INVENTION

The invention concerns a contact-free chip card, comprising a card body incorporating an antenna coupled to an electronic circuit. The card body comprises two outer layers and one intermediate layer placed between the two outer layers. The intermediate layer incorporates the antenna and electronic circuit. Each outer layer is connected to the intermediate layer via a bonding layer, for which the melting point is below that of said outer layers.

In view of the foregoing, a problem which the invention proposes to solve is the manufacture of a card with, on the one hand, a card body incorporating at least three laminated plastic layers directly superimposed on each other, with the second layer placed between the first and third layers, and an electronic module incorporated in said card body, said module comprising an integrated circuit, said card showing good resistance to dynamic bending, and for the manufacture of which the problems of creep and coherence are satisfactorily overcome.

Considering the above-mentioned problem, the first objective of the solution proposed by the invention is a manufacturing process for a card of this type, characterized by the fact that the second layer being a layer in polyethylene terephthalate glycol, and the first and third layers being of a different nature to said second layer,—the first, second and third layers are laminated so as to obtain a first laminated assembly,—a cavity is executed in the second layer,—and the module is inserted in said cavity.

In this way, the PETG is contained between the first and third layers, and does not creep during lamination.

The resultant card also has good coherence, the plastic materials of the three layers having reached their setting point, and the resistance of said card to dynamic bending is better than that for state of the art cards.

The process according to the invention has the advantage of including a subsequent step whereby—said first laminated assembly, in which the module has been inserted, is laminated under temperature and pressure conditions such that the PETG reaches its setting point so that a second laminated assembly is obtained.

The PETG, which has low viscosity under the conditions defined above, then fills the space between the edges of the cavity and the edges of said module, thus ensuring that the module is held firmly in place in the card body.

Another advantage resulting from this step appears when the second lamination, using an operating method particular to the invention, is executed in the presence of a fourth plastic layer. This plastic layer does not undergo the strains normally encountered.

It should be noted that the second objective of the invention is to obtain a card characterized by the fact that said second layer is a layer of polyethylene terephthalate glycol, and that the first and third layers are of a chemical nature different from that of said second layer.

BRIEF DESCRIPTION OF THE DRAWINGS

The invention will be more clearly understood from the following non-exhaustive description, based on the attached drawings where.

DETAILED DESCRIPTION

Figure 1:
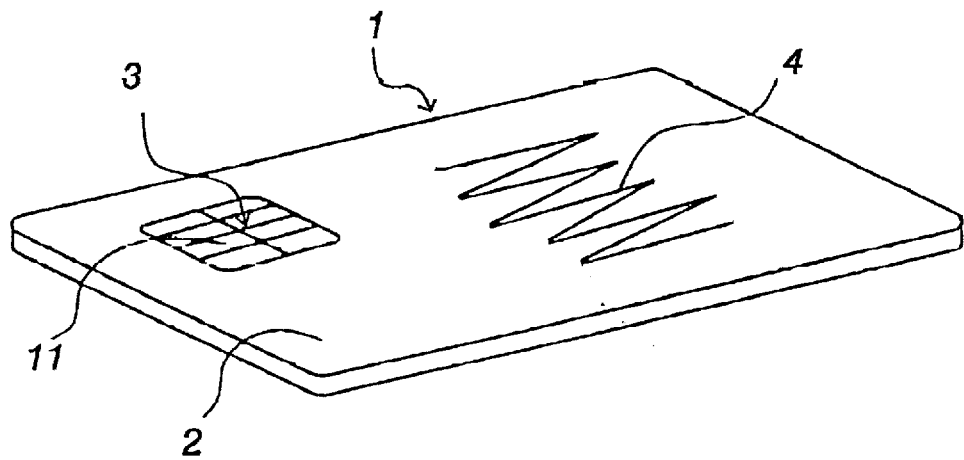
FIG. 1 shows a perspective view of a card according to the invention.

As shown in FIG. 1, card 1 according to the invention comprises card body 2 and electronic module 3 incorporated in said card body 2.

Card body 2 is in the form of a rectangular parallelepiped, the dimensions of which, in accordance with standard ISO 7816, the content of which is incorporated in this description by reference are of the order of 85.6 mm (length), 54 mm (width), and 0.8 mm (thickness).

The card body comprises different laminated plastic layers, directly superimposed on each other. The term "directly superimposed" means that the plastic layers are in direct contract with each other, or in contact with each other via a bonding agent.

Marks 4, such as a bar code, biometric data or a photograph of the holder of card 1, are generally printed on the card. Marks 4 can appear on either or both the main faces of card body 2.

Figure 2:
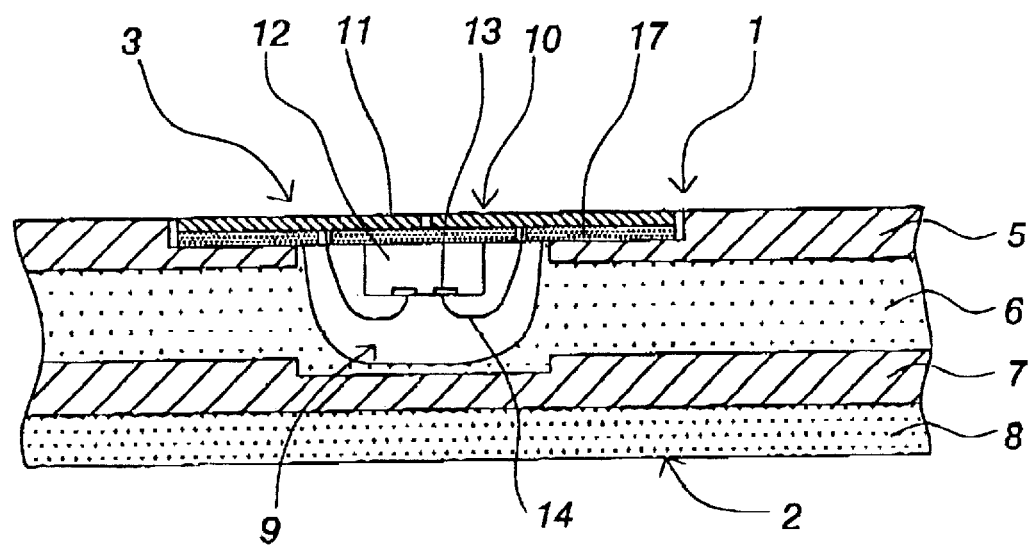
FIG. 2 shows a cross-section view of a card according to the invention.

For the manufacturing method illustrated in FIG. 2, card body 2 comprises four directly superimposed plastic layers. These comprise first plastic layer 5, second layer 6, third layer 7, and fourth layer 8. First layer 5 is a thermoplastic PVC layer, for which the setting point is of the order of 73° C., and the thickness is about 190 $\mu$m. Second layer 6 is a thermoplastic PETG layer, for which the setting point is of the order of 70° C., and the thickness is about 190 $\mu$m. Third layer 7 is a thermoplastic PVC layer, for which the setting point is of the order of 73° C., and the thickness is about 240 $\mu$m. Fourth layer 8 is a plastic layer the thickness of which is the order of 175 $\mu$m, which can be in PVC or any other clear plastic material. First layer 5 is directly superimposed on second layer 6 which is directly superimposed on third layer 7, which is directly superimposed on fourth layer 8. Second layer 6 in PETG is thus placed between first layer 5 and third layer 7 both of which are in PVC. First layer 5 and third layer 7 are of a chemical nature different from that of the PETG of the second layer.

Electronic module 3 is incorporated in card body 2, in a position defined, for example, in the above.-mentioned ISO standard. Module 3 has two main parts: module body 9 embedded in card body 2, and not visible from the exterior, and upper "contact" part 10, comprising contact pads 11 flush with the surface of card body 2. Module body 9 incorporates integrated circuit (chip) 12, contact pads 13 of which are connected electrically, by metal wires 14, to contact pads 11, the assembly comprising integrated circuit 12 and wires 14 being coated with protective resin 16 and reinforced, where appropriate, by a sheet of epoxy, while upper part 10 comprises, in addition to contact pads 11, epoxy support 17 drilled with holes to take wires 14 for connection of integrated circuit 12 to said contact pads 11.

In accordance with a particularly advantageous aspect of the invention, the PETG of second layer 6 is in direct contact with module body 9.

Figure 3:
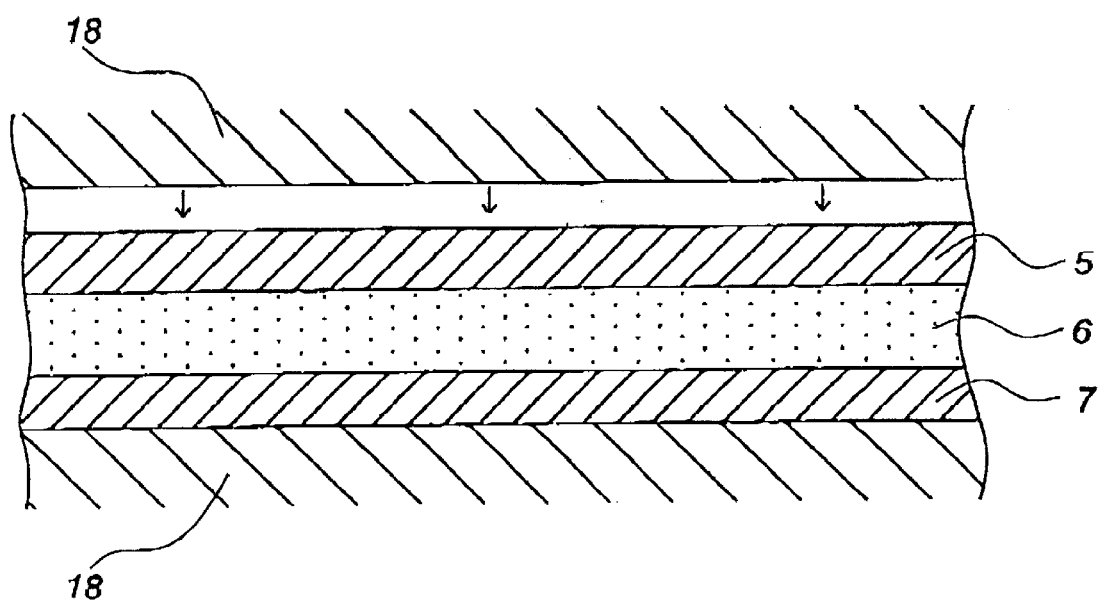
FIG. 3 illustrates, in a cross-section view, a step in the lamination process according to the invention.
Figure 4:
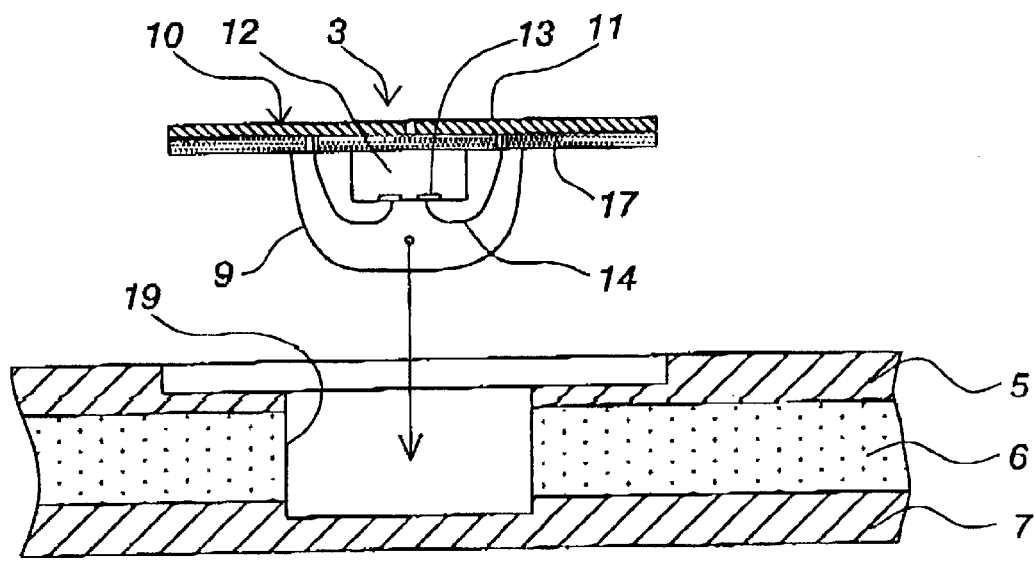
FIG. 4 illustrates, in a cross-section view, a module insertion step according to the invention.
Figure 5:
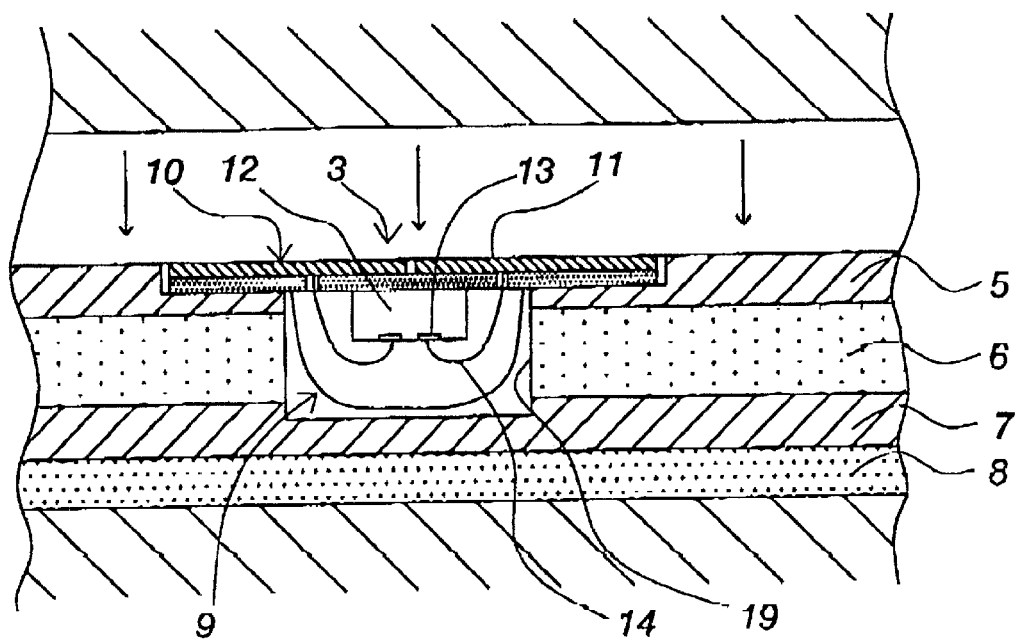
FIG. 5 illustrates, in a cross-section view, a step in the lamination process according to the invention.

The procedure for manufacture of a card in accordance with the invention is as illustrated in FIGS. 3 to 5.

As illustrated in FIG. 3, first layer 5, second layer 6, and third layer 7 are superimposed between plates 18 of a laminating press. The superimposed assembly is then subjected to a first laminating operation, under the pressure and temperature conditions as defined in the following example, where the assembly is raised to a temperature of 115° C., subjected to a pressure of 50 bar for 1 minute, and then to a pressure increasing linearly from 50 bar to 150 bar for 15 minutes. This pressure of 150 bar is then maintained for 4 minutes. The superimposed assembly is then subjected to a pressure exceeding 250 bar for 17 minutes at ambient temperature. This produces a first laminated assembly in which first layer 5, second layer 6, and third layer 7 are bonded together, the plastic materials of said layers having reached their setting point during the first lamination.

The PETG, the viscosity of which is particularly low once the setting point has been reached, is contained between first layer 5 and third layer 7. The PETG does not spread between plates 18.

Naturally, the steps of the process according to the invention described above are executed preferably on sheets of large dimensions, for example of the order of 610 mm long by 475 mm wide. The laminated assemblies then obtained with these large-dimension sheets are cut to obtain about fifty laminated assemblies of card format size.

In a subsequent step in accordance with the invention as illustrated in FIG. 4, cavity 19 is executed, for example by milling, in the first laminated assembly. Cavity 19, designed to receive module 3, is presented in the form of a symmetrical, blind hole of revolution, flared at its top where it presents a shoulder. Cavity 19 penetrates first layer 5 and emerges on second layer 6. As shown in FIG. 4, cavity 19 emerges in second layer 6 and reaches third layer 7.

Module 3 is then inserted in said cavity 19. In practice, module 3 is bonded in cavity 19, the adhesive being located on the shoulder designed to receive upper part 10 of said module 3. A laminated assembly is finally obtained in which module 3 has been incorporated.

This laminated assembly, incorporating module 3, can be stocked, or distributed by card manufacturers to administrative authorities or companies wishing to distribute small quantities of cards. These administrative authorities or companies can be equipped with "office" type laminating and personalization tools, operating card by card at low output rates.

FIG. 5 illustrates a complementary step in accordance with the invention, which can be undertaken by administrative authorities and companies.

The first laminated assembly, incorporating module 3, is directly superimposed on the fourth layer in a card by card laminating tool. The superimposed assembly thus obtained, or second superimposed assembly, is then laminated following a cycle during which said assembly is raised, for example, to a temperature of 150° C. for 4 to 5 seconds, and then cooled progressively to 45° C., at which temperature it is maintained for about 5 minutes at a pressure of the order of 4 to 5 bar.

During this second laminating operation, the PETG reaches its setting point, liquefies and fills the space between the edges of the module body and the edges of the cavity. Fourth layer 8 is not then subject to local strain plumb with module 3, due, in the state of the art, to the fact that it is crushed in the above-mentioned space. Card 1 according to the invention shows no topological or visual fault plumb with said module. It is thus possible to personalize the card body physically, for example by printing marks 4 on layer 8. In certain execution variants for said layer 8, printing inks are sublimated and migrate via said layer 8, increasing the security of card 1.

Cards 1 in accordance with the invention only crack after about 4,500 longitudinal dynamic bends, and 4,500 lateral dynamic bends, with respective deflections of 20 and 10 mm.

Naturally, the execution methods described above are in no way limitative, and the invention can be applied to the manufacture of contact-free cards, in which the module, generally comprising the integrated circuit, is connected to the terminals of an antenna embedded in the card body, without any problem.

What is claimed is:

1. A card comprising a card body including at least three laminated plastic layers directly superimposed on each other, a second layer being a layer of polyethylene terephthalate glycol placed between a first layer and a third layer, said first layer and third layer being of a chemical nature different from that of said second layer, an electronic module being incorporated in a cavity of said card body, said module comprising an integrated circuit, wherein the thickness of said second layer is of the same order of magnitude as that of said first and third layers, and wherein the cavity extends into the second layer from the first layer, and wherein the electronic module is secured within the cavity by liquefied polyethylene terephthalate glycol from the second layer.

2. A manufacturing process for a card comprising a card body including at least three laminated plastic layers directly superimposed on each other, a second layer being a layer of polyethylene terephthalate glycol placed between a first layer and a third layer, said first layer and third layer being of a nature different from that of said second layer, an electronic module being incorporated in said card body, said module comprising an integrated circuit, comprises the steps of:

laminating said first layer, second layer, and third layer together so as to obtain a first laminated assembly, said second layer having a thickness of the same order of magnitude as that of said first and third layers;

creating a cavity extending into the second layer from the first layer;

inserting said module in said cavity; and liquefying at least a portion of the second layer such that liquefied polyethylene terephthalate glycol flows into said cavity to secure said module.

3. A manufacturing process for a card comprising a card body including at least three laminated plastic layers directly superimposed on each other, a second layer being a layer of polyethylene terephthalate glycol placed between a first layer and a third layer, said first layer and third layer being of a nature different from that of said second layer, an electronic module being incorporated in said card body, said module comprising an integrated circuit, comprises the steps of:

laminating said first layer, second layer, and third layer together so as to obtain a first laminated assembly, said second layer having a thickness of the same order of magnitude as that of said first and third layers;

creating a cavity extending into the second layer from the first layer; and inserting said module in said cavity, wherein during a second lamination step the system comprising said first laminated assembly and said module is laminated so as to obtain a second laminated assembly, said second lamination step being executed under pressure and temperature conditions such that the polyethylene terephthalate glycol reaches its Vicat point and flows into the cavity.

4. The process according to claim 3, wherein said first laminated assembly is laminated directly superimposed on a fourth layer.

* * * * *